(12) United States Patent
Chu et al.

(10) Patent No.: US 7,892,891 B2
(45) Date of Patent: Feb. 22, 2011

(54) DIE SEPARATION

(75) Inventors: Chen-Fu Chu, Hsinchu (TW); Trung Tri Doan, Baoshan Township (TW); Chuong Anh Tran, Baoshan Township, Hsinchu County (TW); Chao-Chen Cheng, Hsinchu (TW); Jiunn-Yi Chu, Chubei (TW); Wen-Huang Liu, Guan-Xi Town (TW); Hao-Chun Cheng, Donggang Township, Pingtung County (TW); Feng-Hsu Fan, Jhonghe (TW); Jui-Kang Yen, Taipei (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 11/548,647

(22) Filed: Oct. 11, 2006

(65) Prior Publication Data

US 2008/0194051 A1 Aug. 14, 2008

(51) Int. Cl.
*H01L 21/00* (2006.01)
(52) U.S. Cl. .................. 438/110; 438/113; 438/28; 257/E21.596; 257/E21.599
(58) Field of Classification Search .......... 438/110, 438/113, 28, 33, 458; 257/E21.596, E21.599
See application file for complete search history.

(56) References Cited

U.S. PATENT DOCUMENTS

| 4,615,774 | A  | * | 10/1986 | Somers et al. ............. 205/250 |
| 6,777,647 | B1 | * | 8/2004  | Messal et al. ........... 219/121.84 |
| 6,849,524 | B2 | * | 2/2005  | Shelton et al. ............. 438/465 |
| 2004/0212027 | A1 | * | 10/2004 | Liu .......................... 257/414 |
| 2005/0031822 | A1 |   | 2/2005  | Aihara et al. |
| 2005/0186783 | A1 |   | 8/2005  | Hon et al. |
| 2006/0006554 | A1 | * | 1/2006  | Yoo et al. ................. 257/900 |
| 2006/0011593 | A1 | * | 1/2006  | Fukuyo et al. ......... 219/121.67 |
| 2006/0040472 | A1 |   | 2/2006  | Tamura et al. |
| 2006/0043384 | A1 | * | 3/2006  | Cho et al. .................... 257/79 |
| 2006/0054604 | A1 | * | 3/2006  | Saunders ............... 219/121.69 |
| 2006/0105542 | A1 | * | 5/2006  | Yoo ........................... 438/455 |
| 2006/0151801 | A1 | * | 7/2006  | Doan et al. ................... 257/99 |

OTHER PUBLICATIONS

B.Richerzhagen, R.Housh, F.Wagner and J.Manley, "Water Jet Guided Laser Cutting: a Poweful Hybrid Technology for Fine Cutting and Grooving", www.synova.ch/pdf/ALAC04.pdf, posted Oct. 15, 2004.*
PCT International Search Report and Written Opinion dated Mar. 3, 2008.

* cited by examiner

*Primary Examiner*—Asok K Sarkar
*Assistant Examiner*—Julia Slutsker
(74) *Attorney, Agent, or Firm*—Patterson & Sheridan, L.L.P.

(57) ABSTRACT

Techniques for dicing wafer assemblies containing multiple metal device dies, such as vertical light-emitting diode (VLED), power device, laser diode, and vertical cavity surface emitting laser device dies, are provided. Devices produced accordingly may benefit from greater yields and enhanced performance over conventional metal devices, such as higher brightness of the light-emitting diode and increased thermal conductivity. Moreover, such techniques are applicable to GaN-based electronic devices in cases where there is a high heat dissipation rate of the metal devices that have an original non- (or low) thermally conductive and/or non- (or low) electrically conductive carrier substrate that has been removed.

21 Claims, 3 Drawing Sheets

DIE SEPARATION

TECHNICAL FIELD

Embodiments of the present invention generally relate to a metal device, such as a light emitting diode (LED), a power device, a laser diode, and a vertical cavity surface emitting device, and methods for fabricating the same.

BACKGROUND

Microelectronic devices, such as metal devices, are playing an increasingly important role in our daily life. For instance, LEDs have become ubiquitous in many applications, such as mobile phones, appliances, and other electronic devices. Recently, the demand for nitride-based semiconductor materials (e.g., having gallium nitride or GaN) for opto-electronics has increased dramatically for applications ranging from video displays and optical storage to lighting and medical instruments.

Conventional blue LEDs are formed using compound semiconductor materials with nitride, such as GaN, AlGaN, InGaN, and AlInGaN. Most of the semiconductor layers of these light-emitting devices are epitaxially formed on electrically non-conductive sapphire substrates.

SUMMARY OF THE INVENTION

One embodiment of the invention is a method of dicing a wafer assembly comprising a plurality of semiconductor dies disposed on a metal substrate. The method generally includes applying a laser between a first and a second die to cut through at least a portion of the wafer assembly and applying a physical force to fully separate the first die from the second die.

Another embodiment of the invention is a method of separating a plurality of vertical light-emitting diode (VLED) dies disposed on a metal substrate. The method generally includes applying a laser between adjacent VLED dies of the plurality to cut through any semiconductor material between the adjacent VLED dies and at least a portion of the metal substrate and physically forcing the adjacent VLED dies apart.

DETAILED DESCRIPTION

Embodiments of the invention provide improvements in the art of fabricating light-emitting diodes (LEDs), including higher yield and better performance, such as higher brightness of the LED and better thermal conductivity. Moreover, the description discloses embodiments in the fabrication arts that are applicable to GaN-based electronic devices such as vertical light-emitting diodes (VLEDs), power devices, laser diodes, and vertical cavity surface emitting laser devices in cases where there is a high heat dissipation rate of the metal devices that have an original non- (or low) thermally conductivity and/or non- (or low) electrically conductive substrate that has been removed.

Figure 1A:
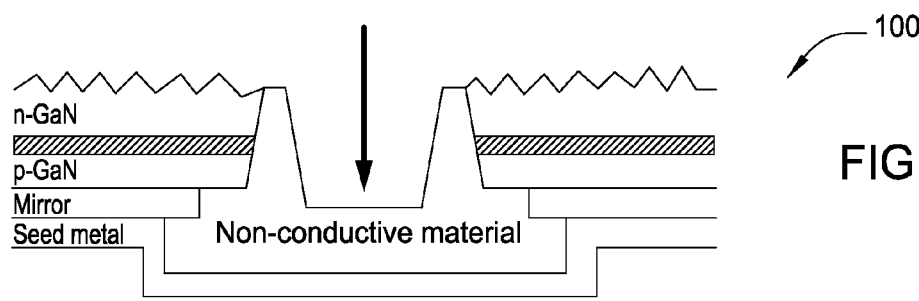
FIGS. 1a-c illustrate dicing a wafer assembly into individual semiconductor dies in accordance with embodiments of the invention.

FIG. 1a depicts an example of a wafer assembly 100a having multiple n-GaN-up vertical light diode emitting (VLED) structures, where the light passes through the n-GaN to the environment outside the VLED structure, that need to be separated into individual semiconductor dies. A multilayer epitaxial structure (EPI) may be formed with an n-type GaN layer, one or more quantum wells with InGaN/GaN layers, and a p-type AlGaN/GaN layer. Although the n-type layer and the p-type layer may comprise various compound semiconductor materials, such as GaN, AlGaN, InGaN, and AlInGaN, n-GaN and p-GaN layers will be described henceforth. Various methods known to those skilled in the art may have been employed to define the distinct VLED structures.

For some VLED structures before die separation, a mirror may be disposed below the p-GaN to act as the reflector for photons. The mirror, by way of example, may be composed of multiple layers, such as Ni/Ag/Ni/Au, Ag/Ni/Au, Ti/Ag/Ni/Au, Ag/Pt or Ag/Pd or Ag/Cr, using an alloy containing Ag, Au, Cr, Pt, Pd, or Al.

One or more electrically non-conductive layers, which may also be thermally conductive layers, (hereinafter referred to as the "non-conductive material") may have been used to fill the street, the area between the defined devices. The non-conductive material that fills the street may also cover at least a portion of the lateral surfaces of the p-GaN in an effort to further protect the multiple quantum well (MQW) active area.

A deposition of one or more metal layers may have been made on top of the mirror and the non-conductive material before the carrier substrate was removed in an effort to create one thick metal plate, for instance, labeled as "metal." In FIG. 1a, the wafer assembly 100a has already been inverted after removal of the carrier substrate, so the metal is shown below the mirror and epitaxial structures. The one or more deposited metal layers may have been formed by electrochemical deposition (ECD) or electroless chemical deposition (ElessCD), CVD, plasma enhanced chemical vapor deposition (PECVD), physical vapor deposition (PVD), evaporation, or plasma spray. The metal layer may be single or multi-layered. In cases where the metal layer is a multi-layered structure, a plurality of metal layers with different composition (e.g., Cu, Ni, Ag, Au, Co, Cu—Co, Cu—Mo, Ni/Cu, Ni/Cu—Mo, and their alloys) may have been formed, and these layers may have been formed using different techniques. For some embodiments, the thickest metal layer may have been deposited using ECD or ElessCD, where the thickest metal layer can be any layer within the multiple layers of metal. The thickness of each metal layer may be about 10~400 µm.

Figure 1B:
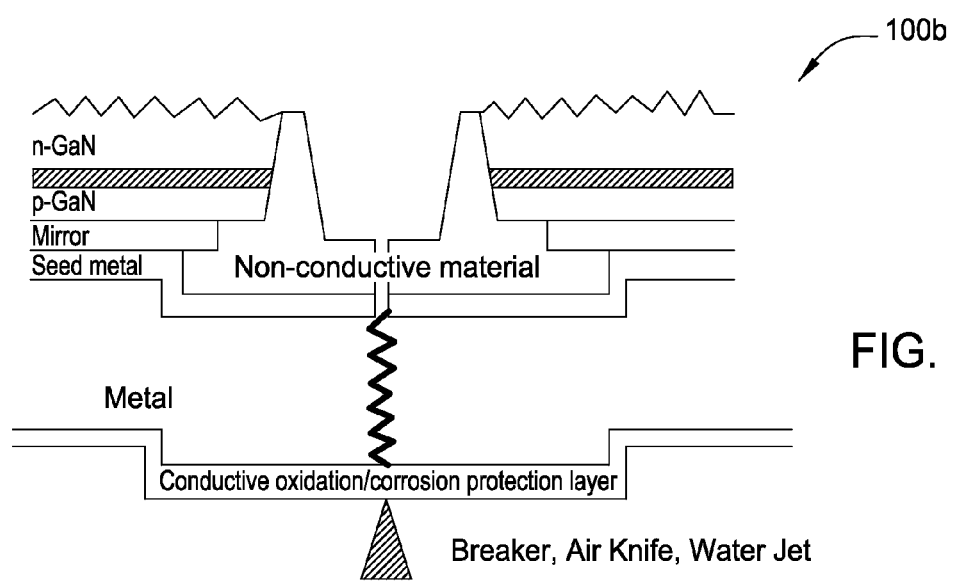
Figure 1C:
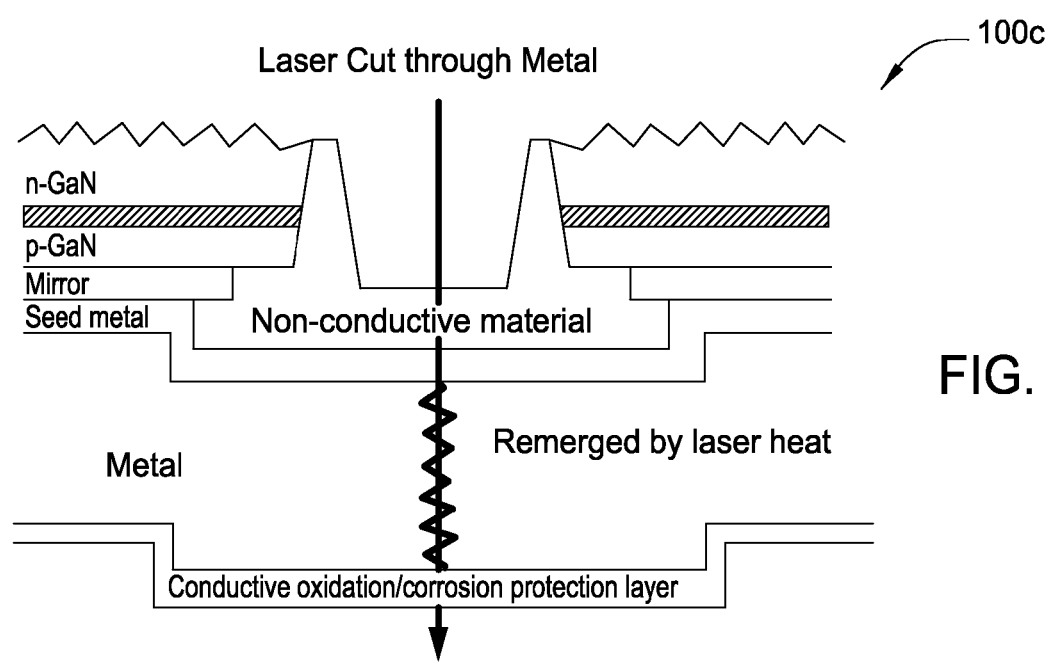

Before depositing the metal layer(s) using electrochemical or electroless chemical deposition techniques, a seed metal that is preferably electrically conductive may have been formed as seen in FIGS. 1a-c. The seed metal may be composed of copper, nickel, or tungsten that may have been deposited as one or more layers by first using evaporation, sputtering, chemical vapor deposition (CVD), or metal organic chemical vapor deposition (MOCVD) of the tungsten before using ECD to form the copper and the nickel. In the case of ECD or ElessCD for the metal layer, a deposit of conductive materials may have been made so as to form a seed metal. The seed metal may have assisted the growth of a single metal layer or of multiple metal layers via electroplating or an electroless plating process. In such cases, the seed metal may have a structure such as Ta/Cu, Ta/TaN/Cu, TaN/Cu, Ti/TaN/Cu, Ta/TiN/Cu, Ti/Cu, Ti/TiN/Cu, TiN/Cu, Cr/Au, Cr/Au/Ni/Au, Cr/Au/Ti/Ni/Au, Ti/Au, or Ti/Ni/Au.

One or more additional metal layers may have been formed above the original metal layer in an effort to protect the underlying metal layers (labeled as "Conductive oxidation/ corrosion protection layer" in FIGS. 1a-c). Such additional protective metal layers may comprise, for example, Cr/Au, Ni, or Ni/Au.

After separating the carrier substrate from the epitaxial wafer assembly and, in some cases, inverting the wafer assembly as shown in FIG. 1a, the wafer assembly may be diced (i.e., dicing into individual semiconductor dies) using various steps. In these steps, methods to separate the dies include using a breaker, an air knife, or a water jet with a chemical solution (for coating the anti-oxidizing material on the cut edge of copper).

For some embodiments, a wafer assembly having dies disposed thereon may be separated by laser cut, saw cut, or water jet processes. This is represented by a downward force seen in wafer assembly 100a in FIG. 1a. After a laser has been used to cut the metal substrate, the metal may remerge together from the laser heating, as seen in wafer assembly 100b in FIG. 1b. Then, the dies may be fully separated by the application of a light force such as by using a breaker, a knife, an air knife, or a water jet, as shown regarding wafer assembly 100c in FIG. 1c.

Figure 2A:
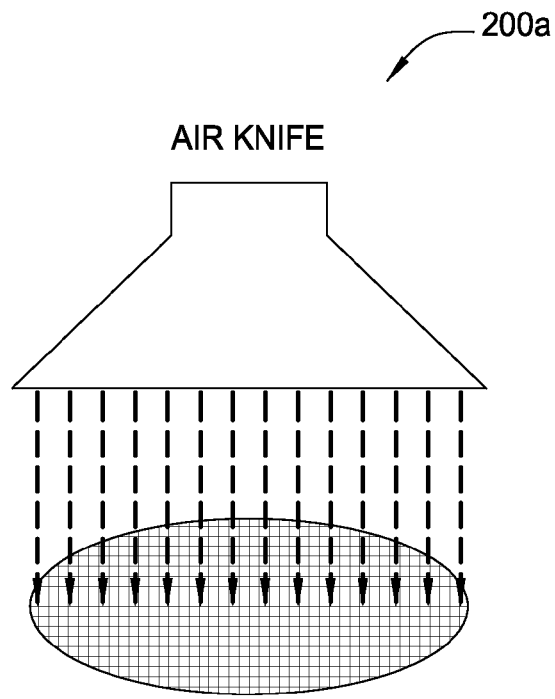
FIGS. 2a-b illustrate dicing the wafer assembly with an air knife or a water jet with a chemical solution in accordance with embodiments of the invention.

In that the force of the breaker may be too strong and cause damage to the electrical devices, the dies may be separated by using an air knife to carefully control the dicing of the wafer, as shown regarding wafer assembly 200a in FIG. 2a.

For the case of laser cutting, it may be advantageous to protect the devices with a removable protecting coating (e.g., a polymer coating) before cutting in order to protect the devices from the debris that can be formed during the laser cutting process. It may also be advantageous to cut the devices in an oxygen-containing environment for manufacturing and junction properties.

After the laser cutting process, the devices may be cleaned in a liquid and/or a solvent in an effort to effectively remove the debris, to remove the protective coating if one is used, and to clean/passivate the junction. The liquid may be a base or an acid solution with or without an oxidizer (e.g., H2SO4:H2O2, HNO3, HNO3/HCl, NH4OH:H2O2, KOH:H2O2, and H3PO4). The solutions may be heated or may be used at room temperature. Any solvent may be used to clean the devices in an effort to remove the removable protective coating on the surface of the wafer. The solvent may be used with or without a surfactant and may be a water solution. The solvent may be used first, followed by the liquid. Alternatively, the liquid may be used first, followed by the solvent. For some embodiments, only the liquid may be used to clean the devices, or only the solvent may be used to clean the devices. It may be preferred, however, to remove the protecting coating first with the solvent, and then clean/passivate the junction with the liquid.

Figure 2B:
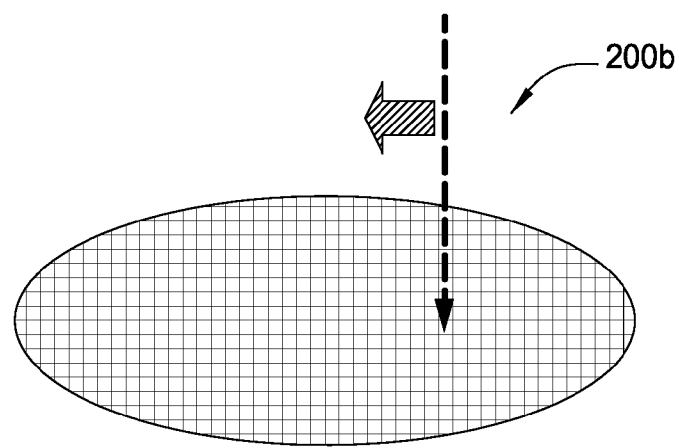

For the dicing, especially after a laser cutting operation, an anti-oxidizing passivation may be applied to the edges of the dies, such as by the use of a chemical water jet solution, as shown in FIG. 2b. The chemical solution may be, for example, a Cu, Pd, Ni, or Au plating solution.

Embodiments disclosed herein may also be applied to the fabrication of GaN-based electronic devices such as power devices, laser diodes, and vertical cavity surface emitting laser device due to its high heat dissipation rate of its metal substrate. Relative to conventional LEDs, the above teaching can improve yield, brightness, and thermal conductivity.

While the foregoing is directed to embodiments of the present invention, other and further embodiments of the invention may be devised without departing from the basic scope thereof, and the scope thereof is determined by the claims that follow.

What is claimed is:

1. A method of dicing a wafer assembly comprising a plurality of semiconductor dies disposed on a metal substrate, the method comprising:
    (a) applying a laser between a first and a second die to cut through at least a portion of the metal substrate, wherein the at least a portion of the metal substrate remerges after applying the laser; and
    (b) applying a physical force to break the remerged portion of the metal substrate and fully separate the first die from the second die.

2. The method of claim 1, further comprising repeating step (a) for all of the plurality of semiconductor dies.

3. The method of claim 2, further comprising repeating step (b) for all of the plurality of semiconductor dies.

4. The method of claim 1, wherein applying the laser comprises applying the laser between the first and the second die to cut through the at least a portion of the metal substrate and any semiconductor material between the first and second dies.

5. The method of claim 1, wherein the metal substrate comprises at least one of Cu, Ni, Au, Ag, Co, or alloys thereof.

6. The method of claim 1, wherein the metal substrate comprises a seed metal layer and a thick metal layer.

7. The method of claim 6, wherein the seed metal layer comprises at least one of Cu, Ni, W, Ta/Cu, Ta/TaN/Cu, TaN/Cu, Ti/TaN/Cu, Ta/TiN/Cu, Ti/Cu, Ti/TiN/Cu, TiN/Cu, Cr/Au, Cr/Au/Ni/Au, Ti/Au, or Ti/Ni/Au.

8. The method of claim 1, wherein the semiconductor dies are light-emitting diode (LED) dies, power device dies, laser diode dies, or vertical cavity surface emitting device dies.

9. A method of separating a plurality of vertical light-emitting diode (VLED) dies disposed on a metal substrate, the method comprising:
    applying a laser between adjacent VLED dies of the plurality to cut through any semiconductor material between the adjacent VLED dies and at least a portion of the metal substrate, wherein the at least a portion of the metal substrate remerges after applying the laser; and
    physically forcing the adjacent VLED dies apart, wherein physically forcing the adjacent VLED dies apart comprises breaking the remerged portion of the metal substrate between the adjacent VLED dies.

10. The method of claim 9, wherein the VLED dies comprise at least one of GaN, AlGaN, InGaN, or AlInGaN.

11. A method of dicing a wafer assembly comprising a plurality of semiconductor dies disposed on a metal substrate having a seed metal layer and a thick metal layer, the method comprising:
    applying a laser between a first and a second die to cut through at least a portion of the wafer assembly, wherein the at least a portion of the wafer assembly includes at least a portion of the thick metal layer, wherein the at least a portion of the thick metal layer remerges after applying the laser; and
    applying a physical force to break the remerged portion of the thick metal layer and fully separate the first die from the second die.

12. The method of claim 11, wherein the at least a portion of the wafer assembly comprises any semiconductor material between the first and second dies and at least a portion of the seed metal layer.

13. The method of claim 11, wherein applying the physical force comprises applying at least one of a breaker, a knife, an air knife, and a water jet.

14. The method of claim 11, further comprising cleaning the first and second dies with a chemical solution.

15. The method of claim 14, wherein the chemical solution comprises at least one of $H_2SO_4$:$H_2O_2$, $HNO_3$, $HNO_3$/HCl, $NH_4OH$:$H_2O_2$, $KOH$:$H_2O_2$, or $H_3PO_4$.

16. The method of claim 11, wherein the seed metal layer comprises at least one of Cu, Ni, W, Ta/Cu, Ta/TaN/Cu, TaN/Cu, Ti/TaN/Cu, Ta/TiN/Cu, Ti/Cu, Ti/TiN/Cu, TiN/Cu, Cr/Au, Cr/Au/Ni/Au, Ti/Au, or Ti/Ni/Au.

17. The method of claim 11, wherein the semiconductor dies are light-emitting diode (LED) dies, vertical light-emitting diode (VLED) dies, power device dies, laser diode dies, or vertical cavity surface emitting device dies.

18. A method of dicing a wafer assembly comprising a plurality of semiconductor dies disposed on a metal substrate, the method comprising:
applying a laser between a first and a second die to cut through at least a portion of the metal substrate; and
applying an air knife to fully separate the first die from the second die after applying the laser.

19. The method of claim 1, wherein applying the physical force comprises applying at least one of a breaker, a knife, and a water jet.

20. The method of claim 1, wherein the metal substrate is formed by depositing a metal or metal alloy using at least one of electrochemical deposition (ECD), electroless chemical deposition (ElessCD), chemical vapor deposition (CVD), plasma enhanced chemical vapor deposition (PECVD), physical vapor deposition (PVD), evaporation, or plasma spray.

21. The method of claim 9, wherein physically forcing the adjacent VLED dies apart comprises applying at least one of a breaker, a knife, an air knife, and a water jet.

* * * * *